United States Patent
Chou

(10) Patent No.: US 9,503,103 B2
(45) Date of Patent: Nov. 22, 2016

(54) PHASE LOCKED LOOP WITH A FREQUENCY MULTIPLIER AND METHOD OF CONFIGURING THE PHASE LOCKED LOOP

(75) Inventor: Mao-Hsuan Chou, Xinfeng Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/569,643

(22) Filed: Aug. 8, 2012

(65) Prior Publication Data

US 2013/0285722 A1   Oct. 31, 2013

Related U.S. Application Data

(60) Provisional application No. 61/640,433, filed on Apr. 30, 2012.

(51) Int. Cl.
| | |
|---|---|
| *H03L 7/06* | (2006.01) |
| *H03L 7/089* | (2006.01) |
| *H03L 7/093* | (2006.01) |
| *H03L 7/099* | (2006.01) |
| *H03L 7/197* | (2006.01) |
| *H03L 7/23* | (2006.01) |

(52) U.S. Cl.
CPC ............. *H03L 7/0898* (2013.01); *H03L 7/093* (2013.01); *H03L 7/0995* (2013.01); *H03L 7/1976* (2013.01); *H03L 7/23* (2013.01)

(58) Field of Classification Search
CPC .................. H01L 2924/00; H01L 2924/00014; H01L 2924/0002; H03L 7/1976; H03L 7/18
See application file for complete search history.

(56) References Cited

U.S. PATENT DOCUMENTS

| | | | | |
|---|---|---|---|---|
| 7,295,824 | B2* | 11/2007 | Kluge et al. ................... | 455/260 |
| 7,453,324 | B2* | 11/2008 | Partridge et al. ............. | 331/154 |
| 8,248,113 | B2* | 8/2012 | Hsieh et al. .................. | 327/105 |
| 2003/0085743 | A1* | 5/2003 | Ullmann et al. .............. | 327/156 |
| 2008/0258835 | A1* | 10/2008 | Galloway et al. ............ | 332/127 |
| 2012/0074995 | A1* | 3/2012 | Zhang ........................... | 327/156 |
| 2013/0086410 | A1* | 4/2013 | Kurd et al. .................... | 713/501 |

FOREIGN PATENT DOCUMENTS

| | | |
|---|---|---|
| CN | 1363891 | 8/2002 |
| WO | WO2011087552 | 7/2011 |

OTHER PUBLICATIONS

Maxim, Adrian, et al., "A Low-Jitter 125-1250-MHz Process-Independnet and Ripple-Poleless 0.18um CMOS PLL Based on a Sample-Reset Loop Filter", IEEE Journal of Solid-State Circuits, vol. 36, No. 11, Nov. 2001, pp. 1673-1683.

(Continued)

*Primary Examiner* — Sibin Chen
(74) *Attorney, Agent, or Firm* — Hauptman Ham, LLP

(57) ABSTRACT

A phase locked loop (PLL) circuit includes a frequency multiplier and a fractional-N type PLL. The clock output of the frequency multiplier is electrically connected to the clock input of the fractional-N type PLL. The loop bandwidth of the frequency multiplier of the PLL is smaller than the loop bandwidth of the fractional-N type PLL of the PLL.

23 Claims, 10 Drawing Sheets

(56) References Cited

OTHER PUBLICATIONS

Huh, Hyungki et al., "A CMOS Dual-Band Fractional-N Synthesizer with Reference Doubler and Compensated Charge Pump", 2004 IEEE International Solid-State Circuits Conference, 10 pages.

Chen, Wei-Ta et al., "A Spread Spectrum Clock Generator for SATA-II", IEEE 2005, pp. 2643-2646.

Yang, Yu-Che, et al., "A Quantization Noise Pushing Technique for $\Delta\Sigma$ Fractional-N Frequency Synthesizers", IEEE Transactions on Microwave Theory and Techniques, vol. 56, No. 4, Apr. 2008, pp. 817-825.

Office Action dated Nov. 18, 2013 from corresponding application No. DE 1002013 100 445.8.

Huang, Shuilong, "Study on Several Critical Techniques of CMOS $\Delta\Sigma$ Fractional-n Frequency Synthesizer", Dissertation Submitted to Tsinghua University for the Doctor of Engineering degree, Apr. 2007, 120 pages. English Abstract is on p. 6-7.

* cited by examiner

PHASE LOCKED LOOP WITH A FREQUENCY MULTIPLIER AND METHOD OF CONFIGURING THE PHASE LOCKED LOOP

CROSS-REFERENCE TO RELATED APPLICATION

The present application claims the priority of U.S. Provisional Application No. 61/640,433, filed Apr. 30, 2012, which is incorporated herein by reference in its entirety.

FIELD OF DISCLOSURE

The present disclosure is related to a phase locked loop (PLL) and, in particular, to a PLL that includes a frequency multiplier.

BACKGROUND

In order to achieve higher data rate transmissions, high speed serial interfaces are widely used recently in electrical products, such as handheld devices, wireless cloud applications, personal computers, and others. In operations at high frequencies such as 3 GHz or above, electrical currents and voltages present in the circuit often suffer from electromagnetic interference (EMI). A spread spectrum clock generator (SSCG) is an effective way of using frequency modulation to reduce EMI. The fractional-N type PLL with a sigma delta modulator (SDM) is a type of SSCG that achieves high resolution with high operation frequency. The fractional-N PLL with the SDM, however, generates SDM quantization noise that deteriorates jitter performance.

DETAILED DESCRIPTION

The making and using of the embodiments of the disclosure are discussed in detail below. It should be appreciated; however, that the embodiments provide many applicable inventive features that can be embodied in a wide variety of specific contexts. The specific embodiments discussed are illustrative, and do not limit the scope of the disclosure.

Some embodiments have one or a combination of the following features and/or advantages. A PLL includes two stages of circuits between an input clock signal and an output clock signal. The first stage of the circuit includes a frequency multiplier, and the second stage of the circuit includes a fractional-N type PLL. In some embodiments, the jitter performance is better when the loop bandwidth of the first stage circuit is smaller than the loop bandwidth of the second stage circuit.

Figure 1A:
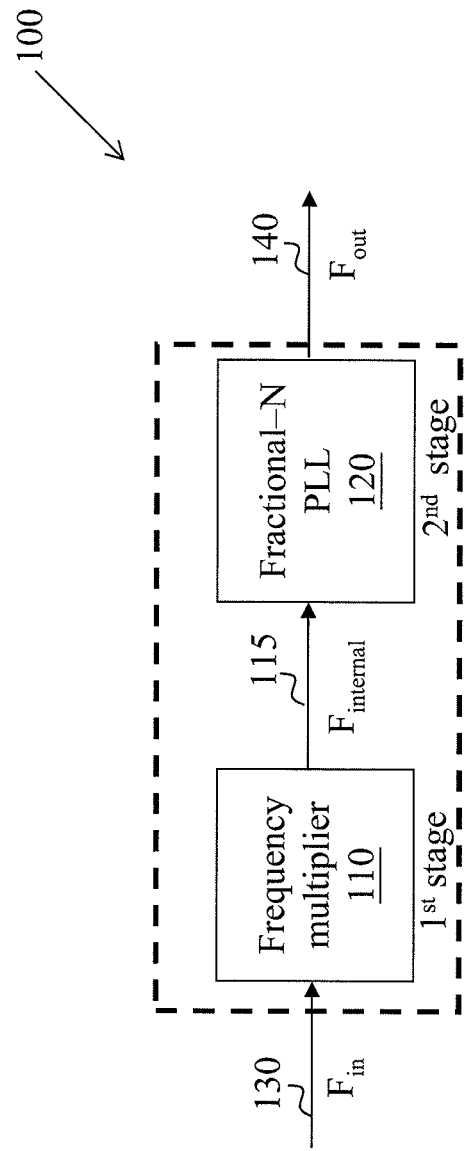
FIG. 1A is a block diagram of a PLL in accordance with some embodiments.

FIG. 1A is a block diagram of a PLL 100 according to some example embodiments. The PLL 100 includes two stages of circuits between an input clock signal $F_{in}$ 130 and an output clock signal $F_{out}$ 140. The first stage circuit of the PLL 100 includes a frequency multiplier 110, and the second stage circuit of the PLL 100 includes a fractional-N type PLL 120. The frequency multiplier 110 receives an input clock signal $F_{in}$ 130, and generates an internal clock signal $F_{internal}$ 115 having a clock frequency that is an integer multiple of that of the input clock signal $F_{in}$ 130. The internal clock signal $F_{internal}$ 115 serves as an input clock signal of the fractional-N type PLL 120. The fractional-N type PLL 120 generates an output clock on the output clock signal $F_{out}$ 140. In some embodiments, the clock frequency on the output clock signal $F_{out}$ 140 is greater than the clock frequency on the internal clock signal $F_{internal}$ 115. In some embodiments, the clock frequency on the internal clock signal $F_{internal}$ 115 is greater than the clock frequency on the input clock signal $F_{in}$ 130.

The output clock frequency of the frequency multiplier 110 on the signal $F_{internal}$ 115 is configured to be less than the maximum operating frequency of a phase and frequency detector (PFD) and a charge pump (CP) of the fractional-N type PLL 120. In some embodiments, the frequency multiplier 110 includes an integer-N type PLL. In some embodiments, the frequency multiplier 110 includes another fractional-N type PLL that is configured to have similar behaviors as the integer-N type PLL to have better jitter performance. In such embodiments, the SDM of the other fractional-N type PLL is disabled to prevent the SDM from generating extra quantization noise.

Figure 1B:
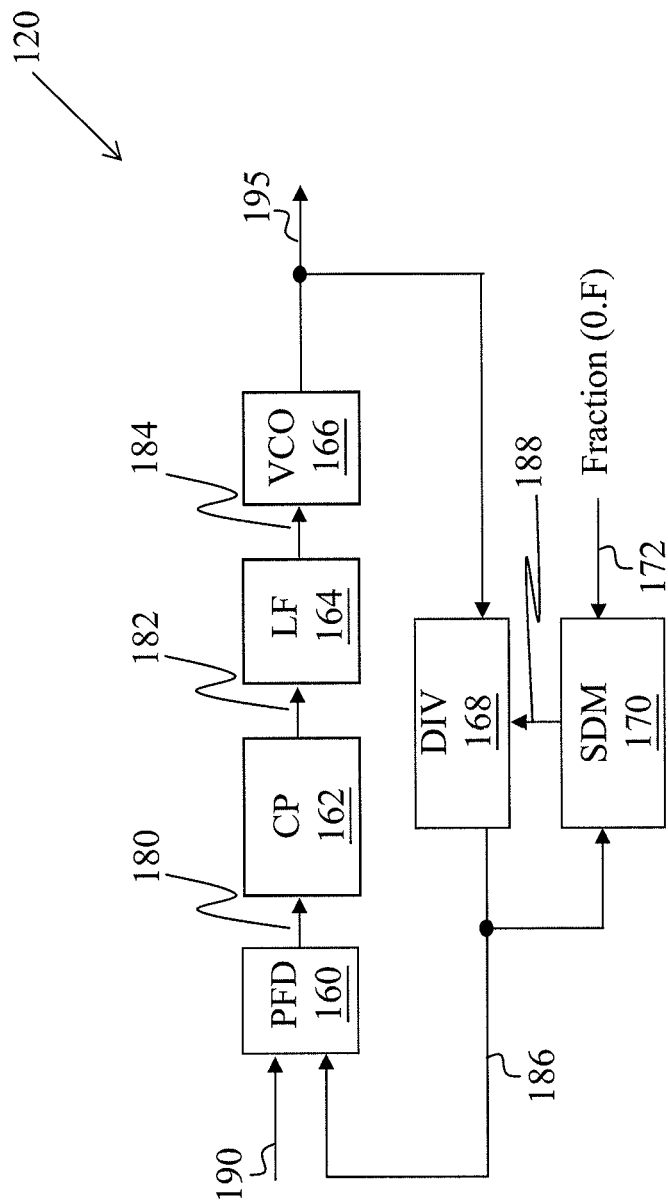
FIG. 1B is a block diagram of a fractional-N type PLL of the PLL in FIG. 1A, in accordance with some embodiments.

FIG. 1B is a block diagram of a fractional-N type PLL 120 according to some embodiments. Fractional-N type PLL 120 has been used by various existing approaches. The fractional-N type PLL 120 includes a phase and frequency detector (PFD) 160, a charge pump (CP) 162, a loop filter (LF) 164, a voltage-controlled oscillator (VCO) 166, a divider (DIV) 168, and a sigma delta modulator (SDM) 170. The PFD 160 receives two inputs, a source clock signal 190 and a local clock signal 186, which is a divided version of an output clock of the VCO 166 on electrical connection 195. The PFD 160 determines the relative phase difference between the source clock signal 190 and the local clock signal 186, and outputs a signal that is proportional to the phase difference and that is fed into the CP 162 through electrical connection 180. The CP 162 converts the input signal into an analog voltage and feeds this analog voltage to the LF 164 through an electrical connection 182. The LF 164 is a low-pass filter that removes the high frequency components in the analog voltage, and outputs a control voltage to the VCO 166 through the electrical connection 184. The VCO 166 increases or decreases the frequency of the output clock on the electrical connection 195 according to the corresponding increased or decreased control voltage. The DIV 168 receives the output clock on the electrical connection 195 and provides the local clock signal 186 to the PFD 160. The frequency of the local clock signal 186 is divided from the frequency of the output clock on the electrical connection 195 by a predetermined ratio. The SDM 170 is used to generate a pseudorandom bit pattern 188 to switch the division ratio of the DIV 168 between 2 divisions. Therefore, a fractional division ratio can be achieved. Moreover, in the application depicted in FIG. 1A, the PLL 120 receives the internal clock signal $F_{internal}$ 115 as the source clock signal 190 and generates the output clock signal $F_{out}$ 140 at the electrical connection 195.

Figure 2:
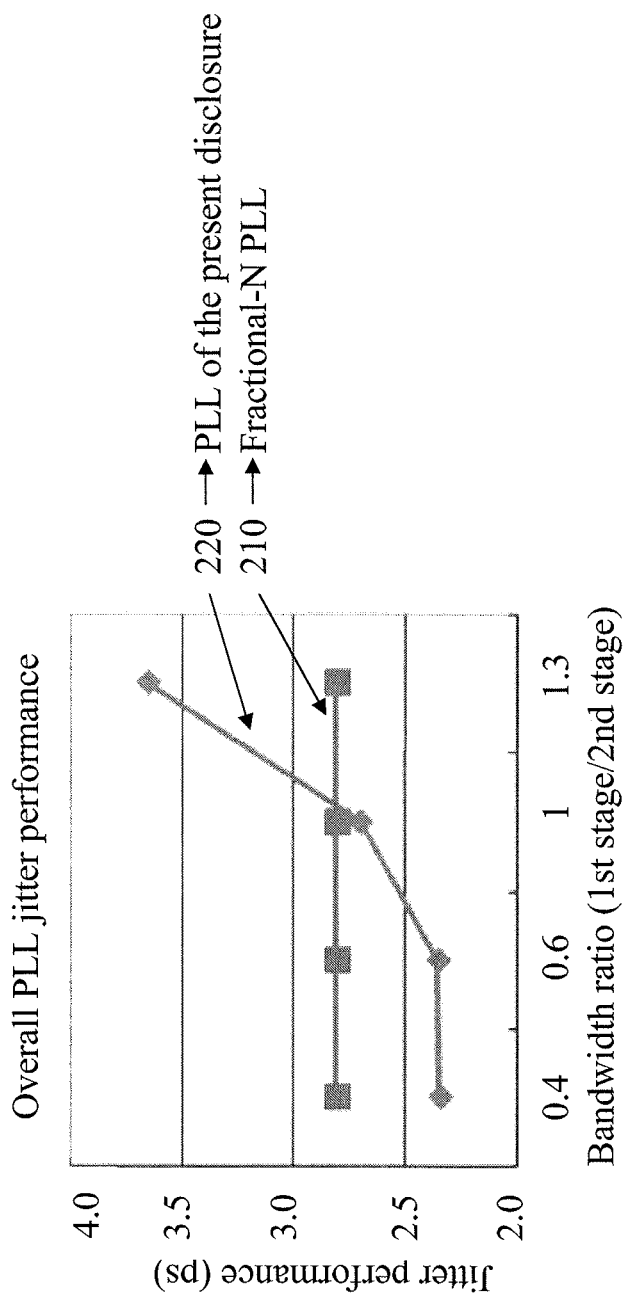
FIG. 2 is a chart of PLL jitter versus PLL bandwidth ratio of the PLL 100 in FIG. 1A and of the fractional-N type PLL in FIG. 1B, in accordance with some embodiments.

FIG. 2 is a chart of PLL jitter performance versus a PLL bandwidth ratio of the PLL 100 in FIG. 1A and of a fractional-N type PLL, such as the PLL 120 in FIG. 1B. The y-axis indicates PLL jitter performances. A smaller value in the y-axis indicates a better jitter performance. The x-axis indicates a bandwidth ratio for the loop bandwidth of the first stage circuit 110 of the PLL 100 over the loop bandwidth of the second stage circuit 120 of the PLL 100. The curve 220 corresponds to the PLL 100 in FIG. 1. The curve 210 corresponds to the fractional-N type PLL 120 in FIG. 1B. The PLL 120 in FIG. 1B is a one-stage circuit such that there is no bandwidth ratio for the PLL 120. Nevertheless, the jitter performance of the fractional-N type PLL is still represented by curve 210 as a constant line regardless of the bandwidth ratio for facilitating a visualized comparison between the performances of the PLL 100 and the PLL 120 alone. As illustratively shown in FIG. 2, the jitter performance represented by the curve 220 is smaller than the jitter performance represented by the curve 210 when the bandwidth ratio in the x-axis is less than 1. As a result, the jitter performance of the PLL 100 in FIG. 1A is better than that of some other existing approaches when the bandwidth ratio is less than 1. When the loop bandwidth of the first stage circuit 110 of the PLL 100 in FIG. 1A is smaller than the loop bandwidth of the second stage circuit 120 of the PLL 100 in FIG. 1A the bandwidth ratio of the PLL 100 is less than 1. According to the chart in FIG. 2, the jitter performance of the PLL 100 in FIG. 1A is better when the bandwidth ratio is less than 0.6. As a result, in some embodiments, a bandwidth ratio of about 0.6 or less is selected for the PLL 100. Other bandwidth ratio values, however, are within the scope of various embodiments. Each bandwidth ratio value for a particular PLL and/or technology is selected by analyzing a corresponding chart illustratively shown in FIG. 2

The loop bandwidths of the first stage circuit 110 and the second stage circuit 120 of the PLL 100 in FIG. 1A are determined according to following equation.

$$\text{Loop bandwidth } F_{bw} = (I_p \times K_{vco} \times R_{eff})/(2\pi \times C_{eff} \times N_f) \quad (1)$$

wherein $I_p$ represents a charge pump current. $K_{vco}$ represents a VCO gain. $R_{eff}$ and $C_{eff}$ represent a corresponding effective resistance and capacitance in the loop filter. $N_f$ represents a feedback path divider ratio.

According to the above equation, there are several parameters that are used to determine the loop bandwidth of the first stage circuit 110 and the second stage circuit 120 of the PLL 100 in FIG. 1A Exemplary parameters include the charge pump current, the VCO gain, the loop filter capacitance, the feedback path divider ratio, etc. In some embodiments, each of the loop bandwidth of the first stage circuit 110 and the second stage circuit 120 are determined based on equation (1) and on adjusting one or a combination of the parameters such that the loop bandwidth of the first stage circuit 110 is less than the loop bandwidth of the second stage circuit 120. In other words, the parameters are adjusted such that the bandwidth ratio of the PLL 100 is less than 1. In some embodiments, the loop bandwidth is directly proportional to the charge pump current, and to the VCO gain. In contrast, the loop bandwidth is inversely proportional to the loop filter capacitances and to the feedback path divider ratio. In some embodiments, these parameters are determined and configured before dies that include the PLL 100 in FIG. 1A are fabricated in view of the design specifications including die areas, power consumption, performance, etc. For example, after each loop bandwidth of the first stage circuit 110 and the second stage circuit 120 is determined, the loop filter capacitance value of the first stage circuit 110 of the PLL 100 in FIG. 1A is increased so that the loop bandwidth of the first stage circuit 110 of the PLL 100 in FIG. 1A is smaller. On the other hand, the loop filter capacitance value of the first stage circuit 110 of the PLL 100 in FIG. 1A is decreased so that the loop bandwidth of the first stage circuit 110 of the PLL 100 in FIG. 1A is larger. As a result, the charge pump current, the VCO gain, the loop filter capacitance and/or the feedback path divider ratio are determined and/or adjusted depending on each of their relationship to the loop bandwidth to increase or decrease the loop bandwidth of the first stage circuit 110. Similarly, the charge pump current, the VCO gain, the loop filter capacitance and/or the feedback path divider ratio are determined and/or adjusted to increase or decrease the loop bandwidth of the second stage circuit 120. During the process of determining and adjusting the loop bandwidth of the first stage circuit 110 and of the second stage circuit 120, the loop bandwidth of the first stage circuit 110 is kept smaller than the loop bandwidth of the second stage circuit 120. In some embodiments, predetermined margins are added for corresponding parameters to compensate for device models and process variations. The predetermined margins vary with different circuit designs, layouts and technology nodes. An example of a predetermined margin is 15%. Other margins are within the scope of various embodiments.

In some embodiments, circuits of the charge pump, the VCO and/or the loop filter of the PLL 100 in FIG. 1A include configurable options. As a result, each of the charge pump current, the VCO gain, the loop filter capacitances, etc., can be further fine-tuned after dies having the PLL 100 are fabricated. In some embodiments, at least one of the charge pump, the VCO and the loop filter in at least one of the first stage circuit 110 and the second stage circuit 120 of the PLL 100 includes configurable options.

Figure 3A:
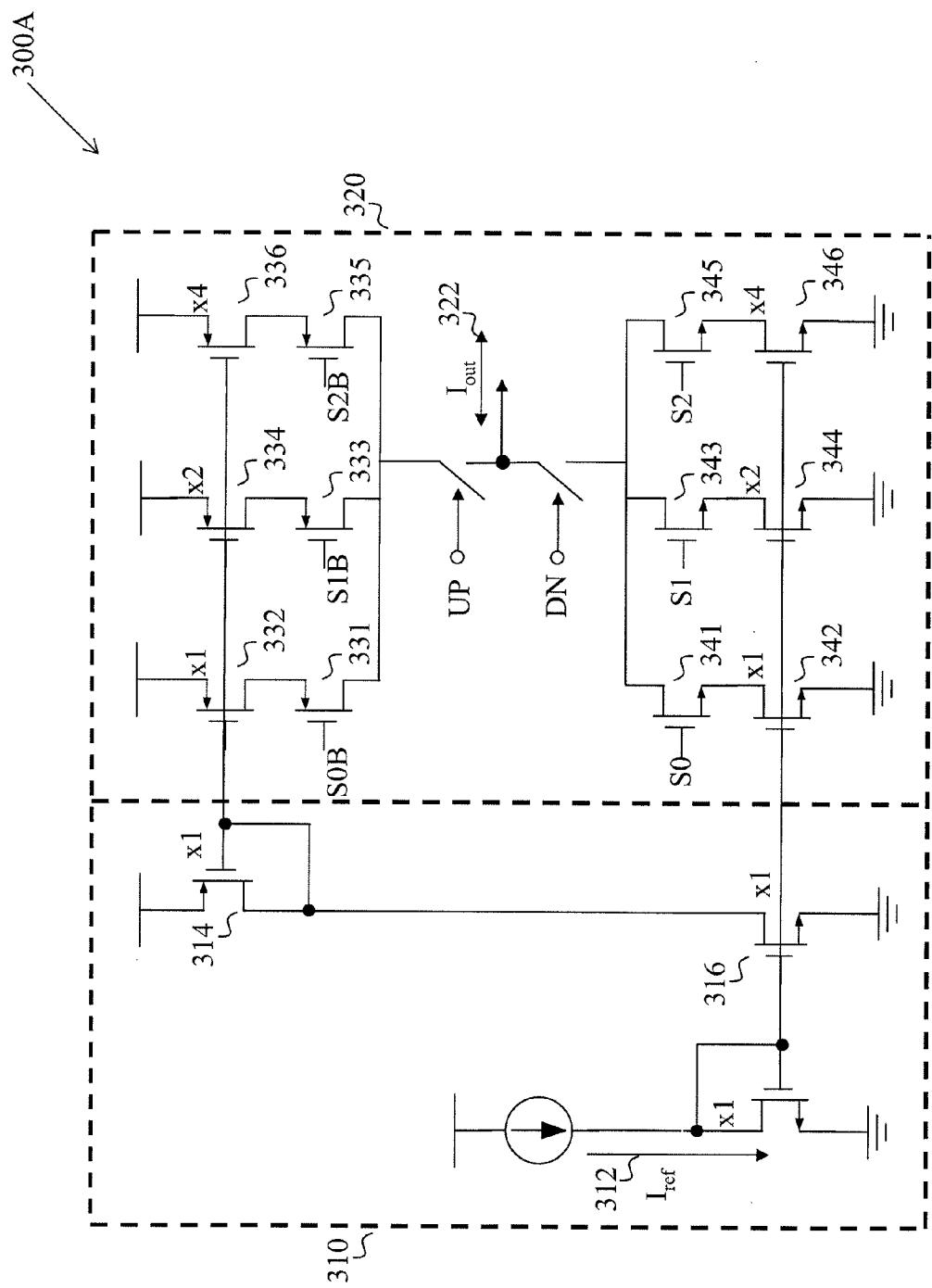
FIG. 3A is a schematic diagram of a charge pump circuit to generate a charge pump current in accordance with some embodiments.

FIG. 3A is a schematic diagram of a charge pump circuit 300A with configurable options to generate a charge pump current according to some example embodiments. The charge pump circuit 300A is usable in the first stage circuit 110 and the second stage circuit 120 depicted in FIG. 1A. The charge pump circuit 300A includes a current mirror circuit 310 and a pump current generating circuit 320. The current mirror circuit 310 includes a reference current $I_{ref}$ 312. The pump current generating circuit 320 includes PMOS transistors 331, 332, 333, 334, 335 and 336, and NMOS transistors 341, 342, 343, 344, 345 and 346. The transistor size of the transistors 332 and 342 is similar to the transistor size of transistors 314 and 316 in the current mirror circuit 310. The transistor size of the transistors 334 and 344 is two times larger than the transistor size of transistors 314 and 316 in the current mirror circuit 310. The transistor size (measurable by a figure of gate width×gate length) of the transistors 336 and 346 is four times larger than the transistor size of transistors 314 and 316 in the current mirror circuit 310. The pump current generating circuit 320 includes an output current $I_{out}$ 322.

In some embodiments, configurable pins "S0, S1, S2" are electrically connected or coupled to or controlled by data outputs of non-volatile memories such as flash memories. The data outputs of the memories provide signals that set logic values on the configurable pins "S0, S1, S2". In some embodiments, the contents of the memories corresponding to the configurable pins "S0, S1, S2" are determined in a process of chip production such as wafer test stage or final test stage, or the like. Once determined, values of the configurable pins are stored in the non-volatile memories, and the values are read out and applied to the configurable pins when system is powered up. In other words, the configurable pins S0, S1, and S2 have corresponding logical values at system power up.

The configurable pin "S0B" is a logical inversion of the configurable pin "S0". The configurable pin "S1B" is a logical inversion of the configurable pin "S1". The configurable pin "S2B" is a logical inversion of the configurable pin "S2". When "S0, S1, S2" are set to "1, 0, 0", "S0B, S1B, S2B" are "0, 1, 1". The transistors 331 and 341 in pump current generating circuit 320 are turned on, and the transistors 333, 335, 343 and 345 in pump current generating circuit 320 are turned off. The output current $I_{out}$ 322 is similar to the reference current $I_{ref}$ 312 in the current mirror circuit 310. When "S0, S1, S2" are set to "0, 1, 0", "S0B, S1B, S2B" are "1, 0, 1". The transistors 333 and 343 in pump current generating circuit 320 are turned on, and the transistors 331, 335, 341 and 345 in pump current generating circuit 320 are turned off. The output current $I_{out}$ 322 is similar to two times of the reference current $I_{ref}$ 312 in the current mirror circuit 310. When "S0, S1, S2" are set to "0, 0, 1", "S0B, S1B, S2B" are "1, 1, 0". The transistors 335 and 345 in pump current generating circuit 320 are turned on, and the transistors 331, 333, 341 and 343 in pump current generating circuit 320 are turned off. The output current $I_{out}$ 322 is similar to four times of the reference current $I_{ref}$ 312 in the current mirror circuit 310. In this way, the output current $I_{out}$ 322 can be further fine-tuned after the dies are fabricated.

Figure 3B:
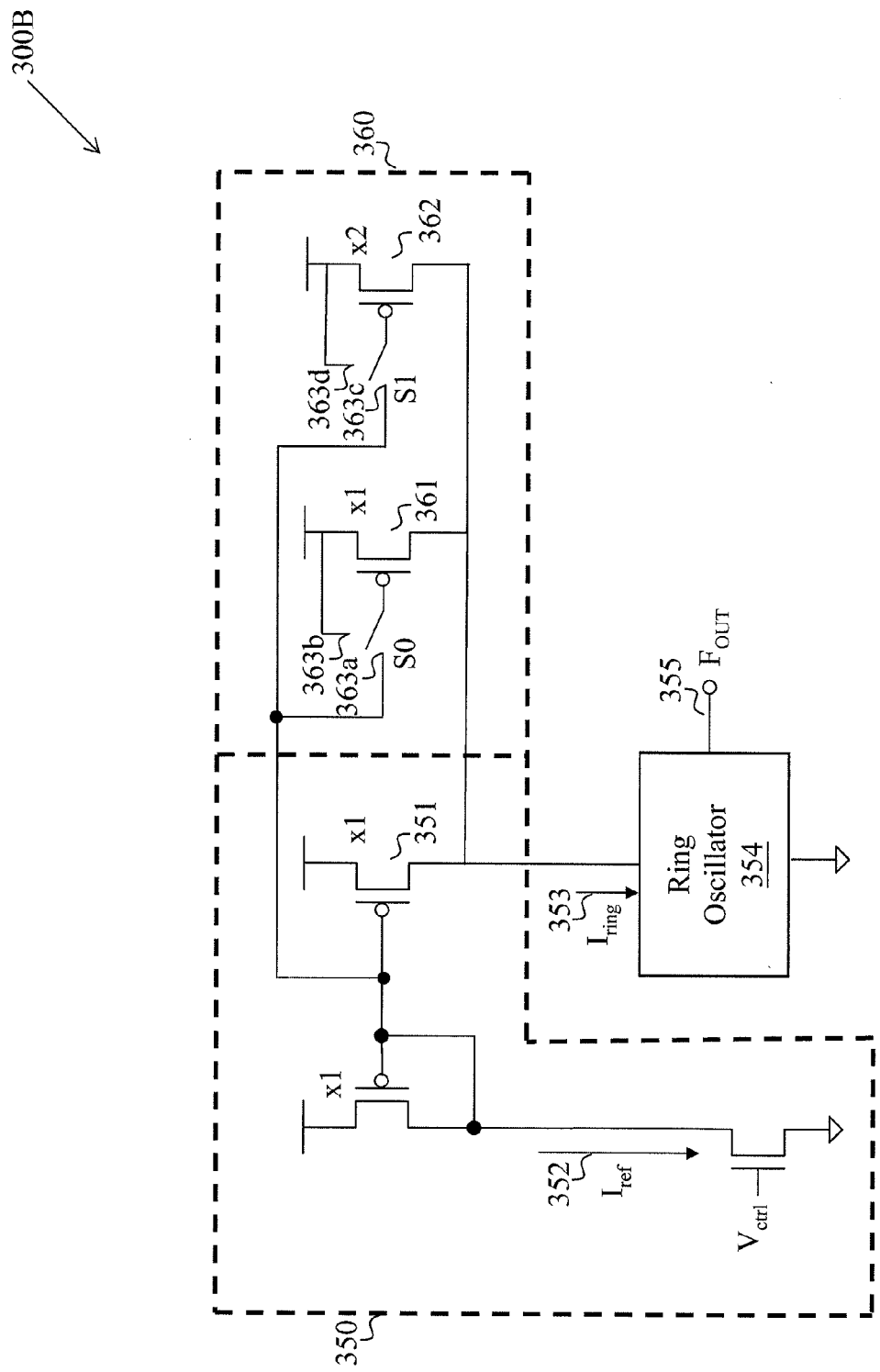
FIG. 3B is a schematic diagram of a voltage-controlled oscillator (VCO) circuit to fine-tune a VCO gain in accordance with some embodiments.

FIG. 3B is a schematic diagram of a VCO circuit 300B with configurable options to fine-tune a VCO gain according to some example embodiments. The VCO circuit 300B includes a current mirror circuit 350, a configurable circuit 360 and a ring oscillator 354. The current mirror circuit 350 includes a reference current $I_{ref}$ 352. The configurable circuit 360 includes PMOS transistors 361 and 362, The transistor size of the transistor 361 is similar to the transistor size of transistor 351 in the current mirror circuit 350. The transistor size of the transistor 362 is two times larger than the transistor size of the transistor 351 in the current mirror circuit 350. The ring oscillator 354 receives an input current $I_{ring}$ 353 and generate an output frequency $F_{out}$ 355. The $F_{out}$ 355 is directly proportional to the current $I_{ring}$ 353 such that the output frequency on $F_{out}$ 355 is higher when the current $I_{ring}$ 353 is larger. The VCO gain of the VCO circuit 300B is directly proportional to the current $I_{ring}$ 353 over the reference current $I_{ref}$ 352 such that the VCO gain of the VCO circuit 300B is larger when the current $I_{ring}$ 353 is larger.

The gate input of the transistor 361 is switched between a point 363a and a point 363b according to a logic value on a configurable pin "P0". When "P0" is set to "1", the gate input of the transistor 361 is electrically connected to the point 363a, when "P0" is set to "0", the gate input of the transistor 361 is electrically connected to the point 363b. The gate input of the transistor 362 is switched between a point 363c and a point 363d according to a logic value on a configurable pin "P1". When "P1" is set to "1", the gate input of the transistor 362 is electrically connected to the point 363c, when "P1" is set to "0", the gate input of the transistor 362 is electrically connected to the point 363d.

In some embodiments, configurable pins "P0, P1" are electrically coupled to or controlled by data outputs of non-volatile memories such as flash memories. The data outputs of the memories provide signals that set logic values on the configurable pins "P0, P1". In some embodiments, the contents of the memories corresponding to the configurable pins "P0, P1" are determined in a process of chip production such as wafer test stage or final test stage, or the like. Once determined, values of the configurable pins are stored in the non-volatile memories, and the values are read out and applied to the configurable pins when system is powered up. In other words, the configurable pins P0 and P1 have corresponding logical values at system power up.

When "P0, P1" are set to "0, 0", the transistors 361 and 362 in configurable circuit 360 are turned off. The $I_{ring}$ 353 is similar to the reference current $I_{ref}$ 352. When "P0, P1" are set to "1, 0", the transistor 361 in configurable circuit 360 is turned on, and the transistor 362 in the configurable circuit 360 is turned off. The $I_{ring}$ 353 is similar to two times of the reference current $I_{ref}$ 352 in the current mirror circuit 350. When "P0, P1" are set to "0, 1", the transistor 361 in the configurable circuit 360 is turned off, and the transistor 362 in the configurable circuit 360 is turned on. The $I_{ring}$ 353 is similar to three times of the reference current $I_{ref}$ 352 in the current mirror circuit 350. In this way, the VCO gain of the VCO 300B can be further fine-tuned after the dies are fabricated.

Figure 3C:
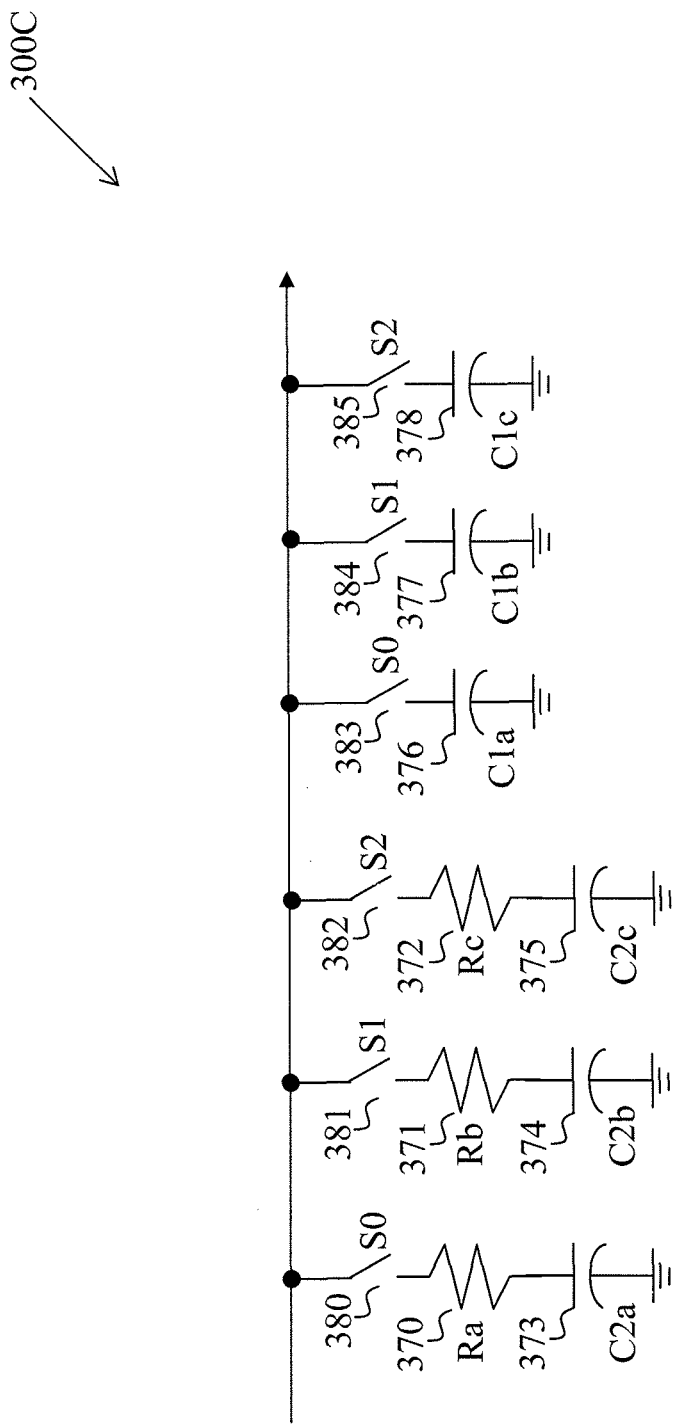
FIG. 3C is a schematic diagram of a loop filter circuit to generate an effective capacitance and resistance in accordance with some embodiments.

FIG. 3C is a schematic diagram of a loop filter circuit 300C with configurable options to generate an effective capacitance according to some example embodiments. The loop filter circuit 300C includes switches 380, 381, 382, 383, 384 and 385. The loop filter circuit 300C further includes resistors 370, 371, 372, and capacitances 373, 374, 375, 376, 377, and 378. The switches 380 and 383 are controlled by a configurable pin "Q0". The switches 381 and 384 are controlled by a configurable pin "Q1". The switches 382 and 385 are controlled by a configurable pin "Q2". When "Q0" is set to "1", the switches 380 and 383 are turned on such that the capacitances 373, 376 and resistor 370 are taken effect. When "Q0" is set to "0", the switches 380 and 383 are turned off such that the capacitances 373, 376 and resistor 370 are not taken effect. When "Q1" is set to "1", the switches 381 and 384 are turned on such that the capacitances 374, 377 and resistor 371 are taken effect. When "Q1" is set to "0", the switches 381 and 384 are turned off such that the capacitances 374, 377 and resistor 371 are not taken effect. When "Q2" is set to "1", the switches 382 and 385 are turned on such that the capacitances 375, 378 and resistor 372 are taken effect. When "Q2" is set to "0", the switches 382 and 385 are turned off such that the capacitances 375, 378 and resistor 372 are not taken effect.

In some embodiments, configurable pins "Q0, Q1, Q2" are electrically coupled to or controlled by data outputs of non-volatile memories such as flash memories. The data outputs of the memories provide signals that set logic values on the configurable pins "Q0, Q1, Q2". In some embodiments, the contents of the memories corresponding to the configurable pins "Q0, Q1, Q2" are determined in a process of chip production such as wafer test stage or final test stage, or the like. Once determined, values of the configurable pins are stored in the non-volatile memories, and the values are read out and applied to the configurable pins when system is powered up. In other words, the configurable pins Q0, Q1, and Q2 have corresponding logical values at system power up.

When "Q0, Q1, Q2" is set to "1, 0, 0", the capacitances 373, 376 and resistor 370 are taken effect. In this case, the effective capacitance is substantially equal to a function of C1a, C2a and Ra. When "S0, S1, S2" is set to "0, 1, 0", the capacitances 374, 377 and resistor 371 are taken effect. In this case, the effective capacitance is substantially equal to a function of C1b, C2b and Rb. When "S0, S1, S2" is set to "0, 0, 1", the capacitances 375, 378 and resistor 372 are taken effect. In this case, the effective capacitance is substantially equal to a function of C1c, C2c and Rc. In this way, the effective capacitance of the loop filter 300C can be further fine-tuned after the dies are fabricated.

Figure 4A:
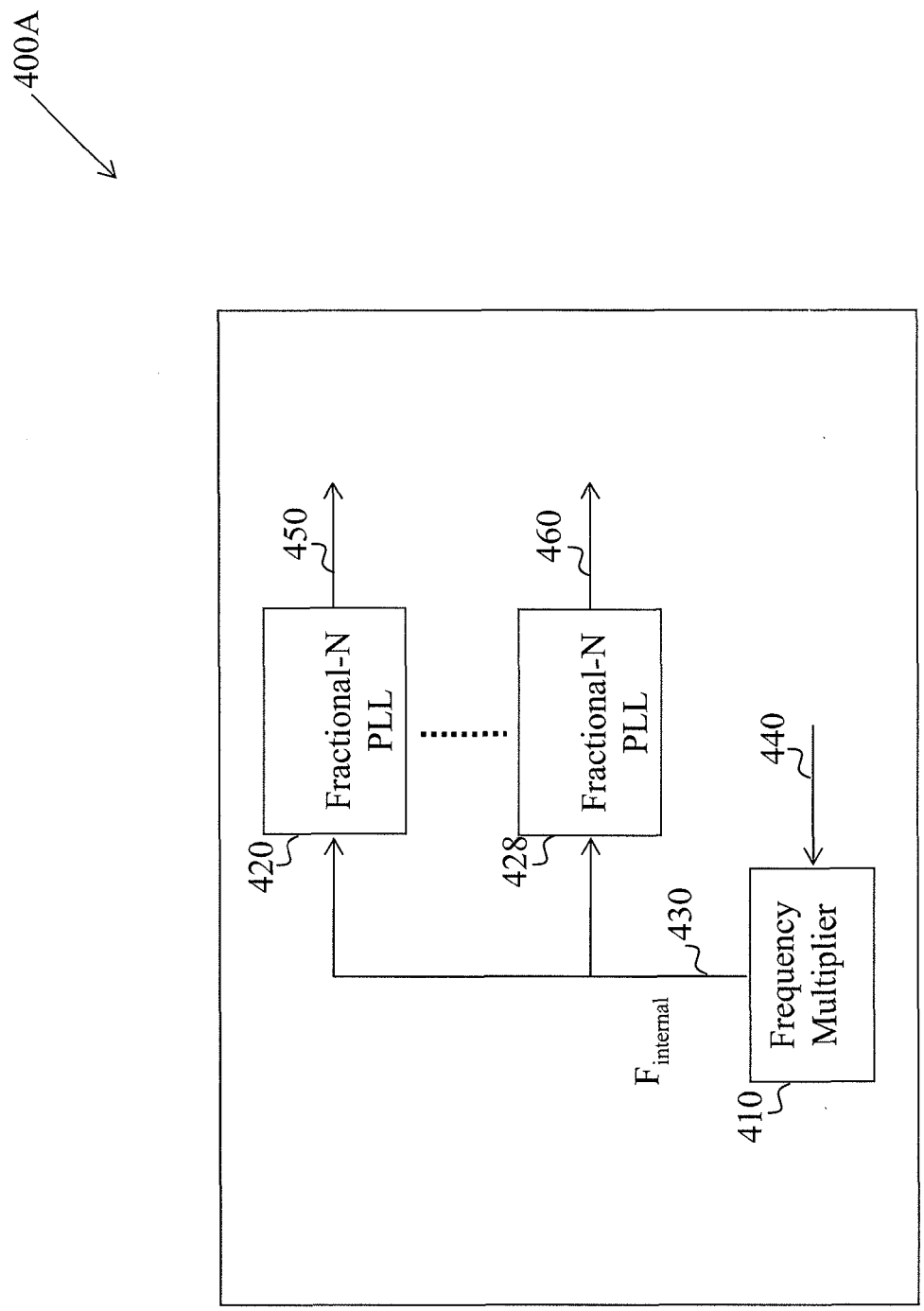
FIG. 4A is a block diagram illustrating another PLL in accordance with some embodiments.

FIG. 4A is a block diagram of a PLL 400A according to some further embodiments. The PLL 400A includes a frequency multiplier 410 and a plurality of fractional-N type PLLs 420 and 428. The frequency multiplier 410 has a reference clock input signal 440, and an output clock signal 430. The output clock signal 430 is also called the clock signal $F_{internal}$, and is electrically connected to the input of each of the plurality of the fractional-N type PLL 420 and 428. Each of the plurality of the fractional-N type PLL 420 and 428 has its own clock output on separated signals. For example, the frequency multiplier 410 plus the fractional-N type PLL 420 form a first PLL, and have a clock output on a signal 450. Similarly, the frequency multiplier 410 plus the fractional-N type PLL 428 form a second PLL, and have a clock output on a signal 460.

The clock frequency of the signal $F_{internal}$ 430 is smaller than the maximum operating frequency of the PFDs and the CPs of the plurality of the fractional-N type PLLs 420. In some embodiments, the frequency multiplier 410 includes an integer-N type PLL. In some embodiments, the frequency multiplier 410 includes another fractional-N type PLL that is configured to have similar behaviors as an integer-N type PLL to have better jitter performance. In such embodiments, the SDM of the fractional-N type PLL is disabled to prevent the SDM from generating extra quantization noise.

In some embodiments, the loop bandwidth of the frequency multiplier 410 in the PLL 400A is smaller than the loop bandwidth of all of the fractional-N type PLLs 420 and 428 in the PLL 400A. Effectively, the bandwidth ratios of the first and second PLLs are all less than 1. In some embodiments, the loop bandwidth of the frequency multiplier 410 in the PLL 400A is smaller than the loop bandwidth of at least one of the fractional-N type PLLs 420 and 428 in the PLL 400A. Effectively, the bandwidth ratio of at least one of the first and second PLLs is less than 1.

Figure 4B:
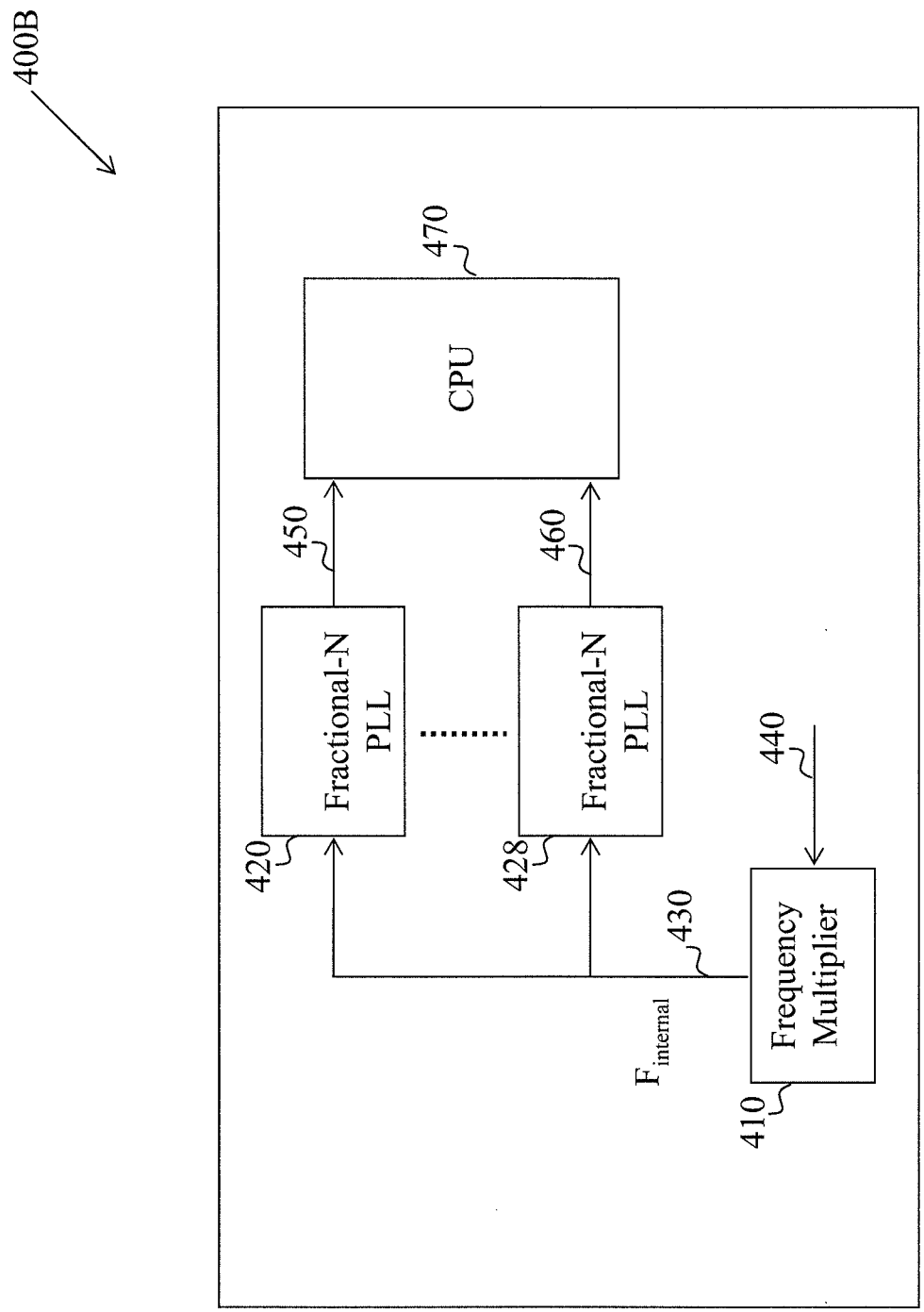
FIG. 4B is a block diagram of a circuit using a PLL in FIG. 4A, in accordance with some embodiments.

In some embodiments, the signals 450 and 460 in FIG. 4A are electrically connected to the same group of circuits such as a central processing unit (CPU), a graphic processing unit (GPU), or the like. FIG. 4B is a block diagram a circuit 400B using the PLL 400A in FIG. 4A to connect the signals 450 and 460 to the same group of circuits according to some embodiments. In the circuit 400B, the frequency multiplier 410 and the plurality of fractional-N type PLLs 420 and 428 are similar to the corresponding ones in FIG. 4A. In some embodiments, the frequency multiplier 410 includes an integer-N type PLL. In some embodiments, the frequency multiplier 410 includes another fractional-N type PLL that is configured to have similar behaviors as an integer-N type PLL to have better jitter performance. In such embodiments, the SDM of the fractional-N type PLL is disabled to prevent the SDM from generating extra quantization noise.

In some embodiments, the loop bandwidth of the frequency multiplier 410 in the PLL 400B is smaller than the loop bandwidth of all of the fractional-N type PLLs 420 and 428 in the PLL 400B. Effectively, the bandwidth ratios of the first and second PLLs are all less than 1. In some embodiments, the loop bandwidth of the frequency multiplier 410 in the PLL 400B is smaller than the loop bandwidth of at least one of the fractional-N type PLLs 420 and 428 in the PLL 400B. Effectively, the bandwidth ratio of at least one of the first and second PLLs is less than 1.

The signals 450 and 460 are electrically connected to the same circuit such as a CPU 470. The CPU 470 comprises clock trees to distribute the clock signals from a common point at a CPU input port to elements in CPU 470 that need the clock signal. The length of the clock trees is directly proportional to the number of elements that need the clock signal in the CPU 470. In FIG. 4B, clock trees in the CPU 470 are shorten as each of the signals 450 and 460 connects to half portions of the elements that need the clock signals in the CPU 470, The variations, power consumption and jitters that are induced by the clock trees are also reduced as the variations, power consumption and jitters are directly proportional to the length of the clock trees. As a result, the speed, area and power performance of CPU 470 are improved.

Figure 4C:
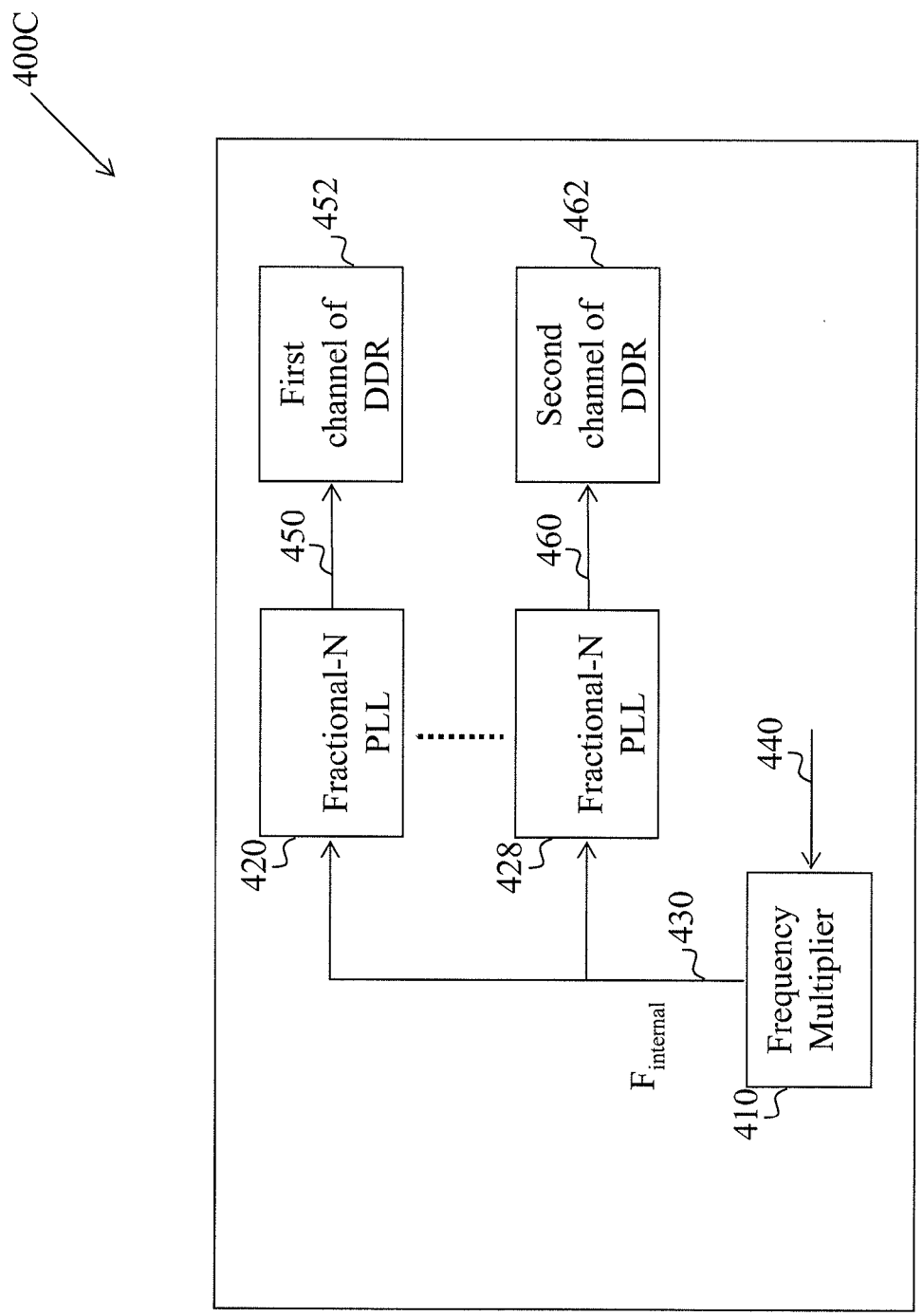
FIG. 4C is a block diagram of another circuit using the PLL of FIG. 4A, in accordance with some embodiments.

In some embodiments, the signals 450 and 460 in FIG. 4A are electrically connected to different groups of circuits such as different channels of double data rate (DDR) memories, or the like. FIG. 4C is another block diagram of a circuit 400C using the PLL 400A in FIG. 4A to connect the signals 450 and 460 to different groups of circuits according to some embodiments. In PLL structure 400C, the frequency multiplier 410 and the plurality of fractional-N type PLLs 420 and 428 are similar to the corresponding ones in FIG. 4A. In some embodiments, the frequency multiplier 410 includes an integer-N type PLL. In some embodiments, the frequency multiplier 410 includes another fractional-N type PLL that is configured to have similar behaviors as an integer-N type PLL to have better jitter performance. In such embodiments, the SDM of the fractional-N type PLL is disabled to prevent the SDM from generating extra quantization noise.

In some embodiments, the loop bandwidth of the frequency multiplier 410 in the PLL 400C is smaller than the loop bandwidth of all of the fractional-N type PLLs 420 and 428 in the PLL 400C. Effectively, the bandwidth ratios of the first and second PLLs are all less than 1. In some embodiments, the loop bandwidth of the frequency multiplier 410 in the PLL 400C is smaller than the loop bandwidth of at least one of the fractional-N type PLLs 420 and 428 in the PLL 400C. Effectively, the bandwidth ratio of at least one of the first and second PLLs is less than 1.

The signal 450 is electrically connected to a circuit such as a first channel of DDR memories, and the signal 460 is electrically connected to another circuit such as a second channel of DDR memories. In the first channel and second channel of DDR memories, clock trees are distributed from a clock source to elements that need the clock. In some embodiments, the clock source is an output of a PLL. The length of the clock trees is directly proportional to the number of elements that need the clock in the first channel and the second channel of DDR memories. The clock trees for each of the first channel and second channel of DDR memories are shorten as there are separated clock trees for each of the first channel and second channel of DDR memories. The variations, power consumption and jitters induced by the clock trees are reduced as the variations, power consumption and jitters are directly proportional to the length of the clock trees. As a result, the speed, area and power performance of channels of DDR memories are improved.

Figure 5:
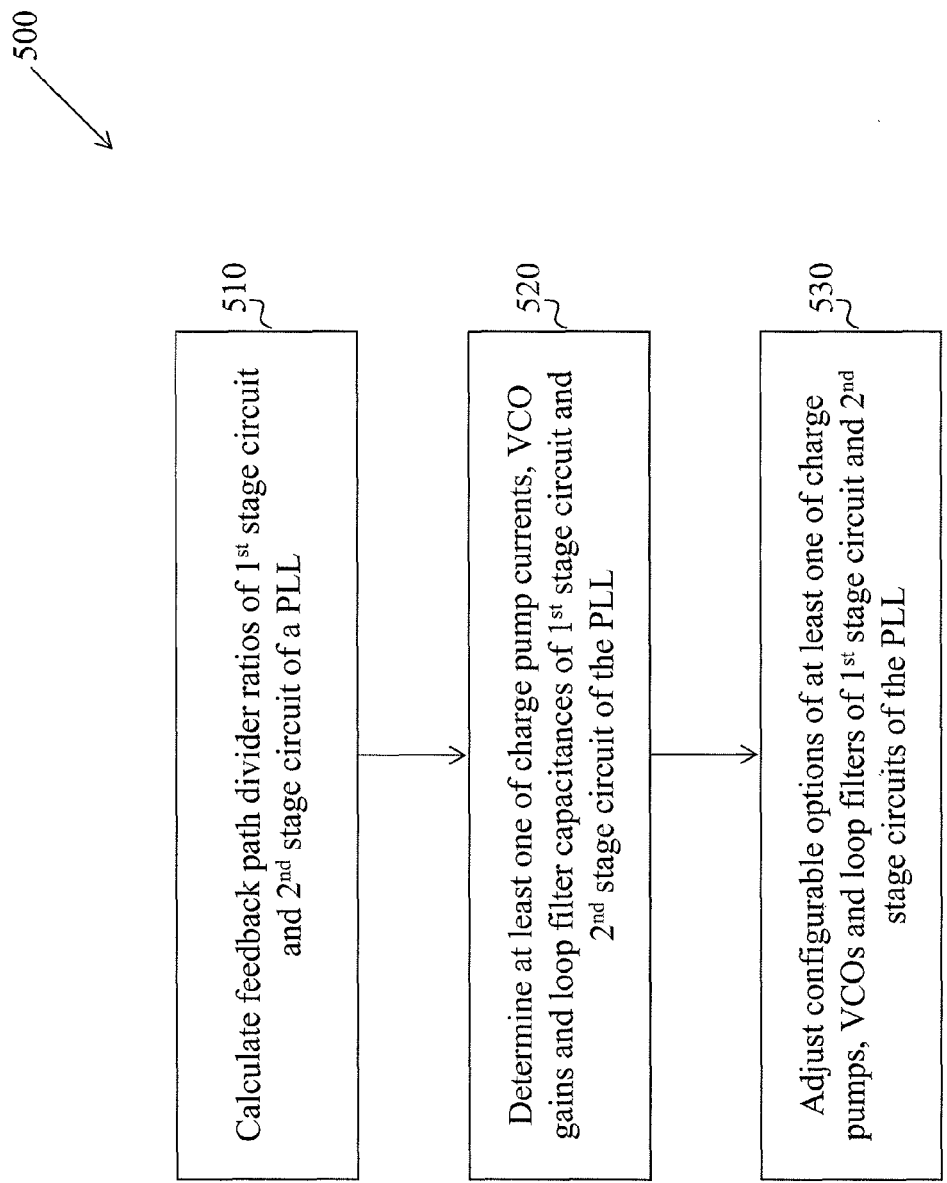
FIG. 5 illustrates a flow chart of a method of configuring a PLL in accordance with some embodiments.

FIG. 5 illustrates a flow chart 500 of a method of configuring the PLL 100 in FIG. 1A according to some example embodiments. The PLL 100 is used as an example for illustration purposes. The method is applicable to other disclosed PLLs and circuits, such as PLL 400A in FIG. 4A, PLL 400B in FIG. 4B, PLL 400C in FIG. 4C.

In step 510, the feedback path divider ratio of the $1^{st}$ stage circuits and the feedback path divider ratio of the $2^{nd}$ stage circuits of the PLL 100 in FIG. 1A are calculated. The input clock frequency and the output clock frequency of the PLL 100 in FIG. 1A are determined. Each feedback path divider ratio of the $1^{st}$ stage and the $2^{nd}$ stage circuits of the PLL 100 in FIG. 1A is calculated based on following equation.

$$\text{feedback path divider ratio} = \frac{\text{output clock frequency}}{\text{input clock frequency}}$$

In step 520, the charge pump current, the VCO gain and the loop filter capacitances of the $1^{st}$ stage and $2^{nd}$ stage circuits of the PLL 100 in FIG. 1A are determined. In some embodiments, predetermined margins, such as 15%, are added for these parameters to compensate for device models and process variations. Based on equation (1), these parameters are designed such that the loop bandwidth of the $1^{st}$ stage circuit of the PLL 100 in FIG. 1A is smaller than the loop bandwidth of the $2^{nd}$ stage circuit of the PLL 100 in FIG. 1A.

In step 530, the configurable options of the charge pumps, the VCOs and/or the loop filters of the first stage circuit 110 and second stage circuit 120 of the PLL 100 in FIG. 1A are adjusted after dies are fabricated such that the loop bandwidth ratio between the first stage circuit 110 and the second stage circuit 120 continues to be less than one.

In some embodiments, a phase locked loop (PLL) circuit includes a frequency multiplier and a fractional-N type PLL. The frequency multiplier comprises a first clock input and a first clock output. The fractional-N type PLL comprises a second clock input and a second clock output. The first clock output of the frequency multiplier is electrically connected to the second clock input of the fractional-N type PLL. A loop bandwidth of the frequency multiplier is less than a loop bandwidth of the fractional-N type PLL.

In some embodiments, a phase locked loop (PLL) circuit includes a frequency multiplier, a first fractional-N type PLL and a second fractional-N type PLL. The first fractional-N type PLL comprises a first clock input and a first clock output. The second fractional-N type PLL comprises a second clock input and a second clock output. The frequency multiplier comprises a third clock input and third clock output. The third clock output of the frequency multiplier is electrically connected to the first clock input of the first fractional-N type PLL to form a first PLL. And, the third clock output of the frequency multiplier is electrically connected to the second clock input of the second fractional-N type PLL to form a second PLL. A forth clock output of the first PLL is electrically connected to the first clock output of the first fractional-N type PLL. A fifth clock output of the second PLL is electrically connected to the second clock output of the second fractional-N type PLL. The loop bandwidth of the frequency multiplier is less than the loop bandwidth of the fractional-N type PLLs in the first and second PLL.

In some embodiments, a method of configuring a phase locked loop (PLL) includes calculating feedback path divider ratios of a first stage circuit and a second stage circuit of the PLL. The method also includes determining at least one of a charge pump currents, a VCO gains and a loop filter capacitances of the first stage circuits and the second stage circuit of the PLL such that the bandwidth ratio of the PLL is less than 1. The method further includes adjusting the configurable options of the at least one of charge pumps, VCOs and loop filters of the first stage circuit and the second stage circuit of the PLL such that the bandwidth ratio of the PLL is less than 1.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase locked loop (PLL) circuit, comprising:
   a frequency multiplier comprising a first clock input and a first clock output; and
   a fractional-N type PLL comprising a second clock input and a second clock output,
   wherein
   the first clock output of the frequency multiplier is electrically connected to the second clock input of the fractional-N type PLL;
   a loop bandwidth of the frequency multiplier is less than a loop bandwidth of the fractional-N type PLL; and
   at least one of the frequency multiplier or the fractional-N type PLL comprises a configurable pin, and the at least one of the frequency multiplier or the fractional-N type PLL is configured to adjust the corresponding loop bandwidth in response to a logic value at the configurable pin.

2. The phase locked loop (PLL) circuit of claim 1, wherein the frequency multiplier further comprises an integer-N type PLL that comprises a clock input and a clock output, and the clock input of the integer-N type PLL is electrically connected to the first clock input, and the clock output of the integer-N type PLL is electrically connected to the first clock output.

3. The phase locked loop (PLL) circuit of claim 1, wherein
   the at least one of the frequency multiplier or the fractional-N type PLL further comprises a charge pump, a voltage controlled oscillator (VCO) and a loop filter; and
   the configurable pin is arranged to adjust an electrical characteristic of at least one of the charge pump, the VCO, or the loop filter.

4. The PLL circuit of claim 3, wherein the electrical characteristic of the charge pump is a charge pump current, the electrical characteristic of the VCO is a VCO gain, and the electrical characteristic of the loop filter is a loop filter capacitance.

5. The phase locked loop (PLL) circuit of claim 1, wherein the logic value for the configurable pin is predetermined.

6. The phase locked loop (PLL) circuit of claim 1, wherein the fractional-N type PLL further comprises a phase and frequency detector (PFD) and a charge pump (CP), and an output clock frequency of the frequency multiplier is less than an operating frequency of the PFD and of the CP of the fractional-N type PLL.

7. The phase locked loop (PLL) circuit of claim 1, wherein a bandwidth ratio of the loop bandwidth of the frequency multiplier over the loop bandwidth of the fractional-N type PLL is less than 0.6.

8. A phase locked loop (PLL) circuit, comprising:
  a first fractional-N type PLL comprising a first clock input and a first clock output;
  a second fractional-N type PLL comprising a second clock input and a second clock output; and
  a frequency multiplier comprising a third clock input and a third clock output;
  wherein
    the third clock output of the frequency multiplier is electrically connected to the first clock input of the first fractional-N type PLL to form a first PLL;
    the third clock output of the frequency multiplier is electrically connected to the second clock input of the second fractional-N type PLL to form a second PLL;
    a fourth clock output of the first PLL is electrically connected to the first clock output of the first fractional-N type PLL;
    a fifth clock output of the second PLL is electrically connected to the second clock output of the second fractional-N type PLL;
    a loop bandwidth of the frequency multiplier is less than a loop bandwidth of each of the fractional-N type PLLs in the first PLL and the second PLL; and
    at least one of the frequency multiplier or the fractional-N type PLLs comprises a configurable pin, and the at least one of the frequency multiplier or the fractional-N type PLLs is configured to adjust the corresponding loop bandwidth in response to a logical value at the configurable pin.

9. The phase locked loop (PLL) circuit of claim 8, wherein the frequency multiplier further comprises an integer-N type PLL that comprises a clock input and a clock output, and the clock input of the integer-N type PLL is electrically connected to the third clock input, and the clock output of the integer-N type PLL is electrically connected to the third clock output.

10. The phase locked loop (PLL) circuit of claim 8, wherein the at least one of the frequency multiplier or the fractional-N type PLLs further comprises a charge pump, a voltage controlled oscillator (VCO) and a loop filter; and
  the configurable pin is arranged to adjust an electrical characteristic of at least one of the charge pump, the VCO, or the loop filter in the at least one of the frequency multiplier or the fractional-N type PLLs.

11. The PLL circuit of claim 10, wherein the electrical characteristic of the charge pump is a charge pump current, the electrical characteristic of the VCO is a VCO gain, and the electrical characteristic of the loop filter is a loop filter capacitance.

12. The phase locked loop (PLL) circuit of claim 8, wherein the logic value for the configurable pin is predetermined.

13. The phase locked loop (PLL) circuit of claim 12, wherein the configurable pin is electrically connected to a data output of a non-volatile memory.

14. The phase locked loop (PLL) circuit of claim 8, wherein the fourth clock output is electrically connected to a first group of circuits, and the fifth clock output is electrically connected to a second group of circuits.

15. The phase locked loop (PLL) circuit of claim 8, wherein the fourth clock output and the fifth clock output are electrically connected to a first group of circuits.

16. The phase locked loop (PLL) circuit of claim 8, wherein a bandwidth ratio of the loop bandwidth of the frequency multiplier over the loop bandwidth of the first fractional-N type PLL or over the loop bandwidth of the second fractional-N type PLL is less than 0.6.

17. A method of configuring a phase locked loop (PLL), comprising:
  calculating a feedback path divider ratio of a first stage circuit of the PLL;
  calculating a feedback path divider ratio of a second stage circuit of the PLL;
  determining at least one of a charge pump current, a voltage controlled oscillator (VCO) gain, or a loop filter capacitance of at least one of the first stage circuit or the second stage circuit of the PLL such that a bandwidth ratio of a loop bandwidth of the first stage circuit over a loop bandwidth of the second stage circuit is less than 1; and
  adjusting, by applying a logic value to a configurable pin, a configurable option of the at least one of the charge pump current, the VCO gain, or the loop filter capacitance of the at least one of the first stage circuit or the second stage circuit of the PLL such that the bandwidth ratio continues to be less than 1.

18. The method of claim 17, wherein the first stage circuit of the phase locked loop (PLL) comprises an integer-N type PLL, and a clock input of the integer-N type PLL is electrically connected to a clock input of the first stage circuit of the PLL, and a clock output of the integer-N type PLL is electrically connected to a clock output of the first stage circuit of the PLL.

19. The method of claim 17, wherein the second stage circuit further comprises a phase and frequency detector (PFD) and a charge pump (CP), and an output clock frequency of the first stage circuit is less than an operating frequency of the PFD and the CP of the second stage circuit.

20. The method of claim 17, wherein the second stage circuit of the phase locked loop (PLL) comprises a fractional-N type PLL, and a clock input of the fractional-N type PLL is electrically connected to a clock input of the second stage circuit of the PLL, and a clock output of the fractional-N type PLL is electrically connected to a clock output of the second stage circuit of the PLL.

21. The method of claim 17, wherein applying the logic value to the configurable pin comprises applying a predetermined logic value to the configurable pin.

22. The method of claim 21, wherein the configurable pin is connected to a data output of a non-volatile memory.

23. The method of claim 21, wherein the bandwidth ratio is less than 0.6.

* * * * *